(12) United States Patent
Joshi

(10) Patent No.: US 7,092,280 B2
(45) Date of Patent: Aug. 15, 2006

(54) SRAM WITH DYNAMICALLY ASYMMETRIC CELL

(75) Inventor: Rajiv V. Joshi, Yorktown Heights, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 10/996,284

(22) Filed: Nov. 22, 2004

(65) Prior Publication Data

US 2006/0109706 A1    May 25, 2006

(51) Int. Cl.
*G11C 11/00* (2006.01)

(52) U.S. Cl. ........................ 365/154; 365/226

(58) Field of Classification Search ................ 365/154, 365/226
See application file for complete search history.

(56) References Cited

U.S. PATENT DOCUMENTS

| | | | | |
|---|---|---|---|---|
| 5,075,887 A | * | 12/1991 | Magome et al. | 365/222 |
| 5,773,997 A | * | 6/1998 | Stiegler | 327/53 |
| 6,775,186 B1 | * | 8/2004 | Eshel | 365/185.21 |
| 6,801,463 B1 | * | 10/2004 | Khellah et al. | 365/203 |

* cited by examiner

*Primary Examiner*—Michael Tran
(74) *Attorney, Agent, or Firm*—Law Office of Charles W. Peterson, Jr.; Louis J. Percello, Esq.; Satheesh K. Karra, Esq.

(57) ABSTRACT

A CMOS static random access memory (SRAM) array with dynamically asymmetric cells, an integrated circuit (IC) chip including the SRAM and a method of accessing data in the SRAM. Each column of cells is connected to a pair of column supply lines supplying power to the column. During each SRAM access, a higher voltage is applied to one column supply line in each pair of the columns being accessed to unbalance cells in the columns being accessed. Unbalanced cells become asymmetric during accesses and the supply imbalance favors the data state being written/read.

39 Claims, 5 Drawing Sheets

SRAM WITH DYNAMICALLY ASYMMETRIC CELL

FIELD OF THE INVENTION

The present invention is related to improving static random access memory (SRAM) performance and more particularly to improving SRAM cell read and write times.

BACKGROUND DESCRIPTION

Integrated circuits (ICs) are commonly made in the well-known complementary insulated gate field effect transistor (FET) technology known as CMOS. CMOS technology and chip manufacturing advances have resulted in a steady decrease of chip feature size to increase on-chip circuit switching frequency (circuit performance) and the number of transistors (circuit density). In what is typically referred to as scaling, device or field effect transistor (FET) features are shrunk to shrink corresponding device minimum dimensions including both horizontal dimensions (e.g., minimum channel length) and vertical dimensions, e.g., channel layer depth, gate dielectric thickness, junction depths and etc. Shrinking device size increases device density and device performance, as well as reduces device-operating conditions, i.e., chip and correspondingly, device supply voltages and voltage swings. Consequently, as a result of scaling otherwise seemingly neglectable device-to-device variations (e.g., length, width, threshold and etc.) have caused serious design problems, especially in signal critical circuits such as memory cells and sense amplifiers.

A typical CMOS circuit, for example, includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa. For example, a CMOS inverter is a series connected PFET and NFET pair that are connected between a power supply voltage (Vdd) and ground (GND).

A typical static random access memory (SRAM) cell, ideally includes a balanced pair of cross-coupled inverters storing a single data bit with a high at the output of one inverter and a low at the output of the other. A pair of pass gates (also ideally, a balanced pair of FETs) selectively connects the complementary outputs of the cross-coupled inverter to a corresponding complementary pair of bit lines. A word line connected to the gates of the pass gate FETs selects connecting the cell to the corresponding complementary pair of bit lines. During a write, the pass gates are turned on and the bit line contents are coupled to the cross-coupled inverters, which fight the switch until the cell voltages cross and the cross-coupled inverters take over. Typically, most of the switching is done by cell NFETs, because the off-PFET does not turn on until the high-side (at the on-PFET) is pulled at least to the PFET threshold below the supply voltage, perhaps as much as ⅓ or ½ or more of the supply voltage. Similarly, during a read, each cell on the selected word line couples its contents to its corresponding bit line pair through NFET pass gates. Since the bit line pair is typically pre-charged to some common voltage, initially, the internal (to the cell) low voltage rises until one of the bit line pairs droops sufficiently to develop a small difference signal (e.g., 50 mV). Thus, in these prior art cells the NFETs did most, if not all of the switching and so, considerably design effort is expended tweaking cell NFET sizes to improve read and write performance.

Thus, there is a need for improved storage cell performance and particularly, SRAM cell performance.

SUMMARY OF THE INVENTION

It is a purpose of the invention to improve storage cell performance;

It is another purpose of the invention to reduce the SRAM cell access time;

It is yet another purpose of the invention to reduce SRAM cell read and write time.

The present invention relates to a CMOS static random access memory (SRAM) array with dynamically asymmetric cells, an integrated circuit (IC) chip including the SRAM and a method of accessing data in the SRAM. Each column of cells is connected to a pair of column supply lines supplying power to the column. During each SRAM access, a higher voltage is applied to one column supply line in each pair of the columns being accessed to unbalance cells in the columns being accessed. Unbalanced cells become asymmetric during accesses and the supply imbalance favors the data state being written/read.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
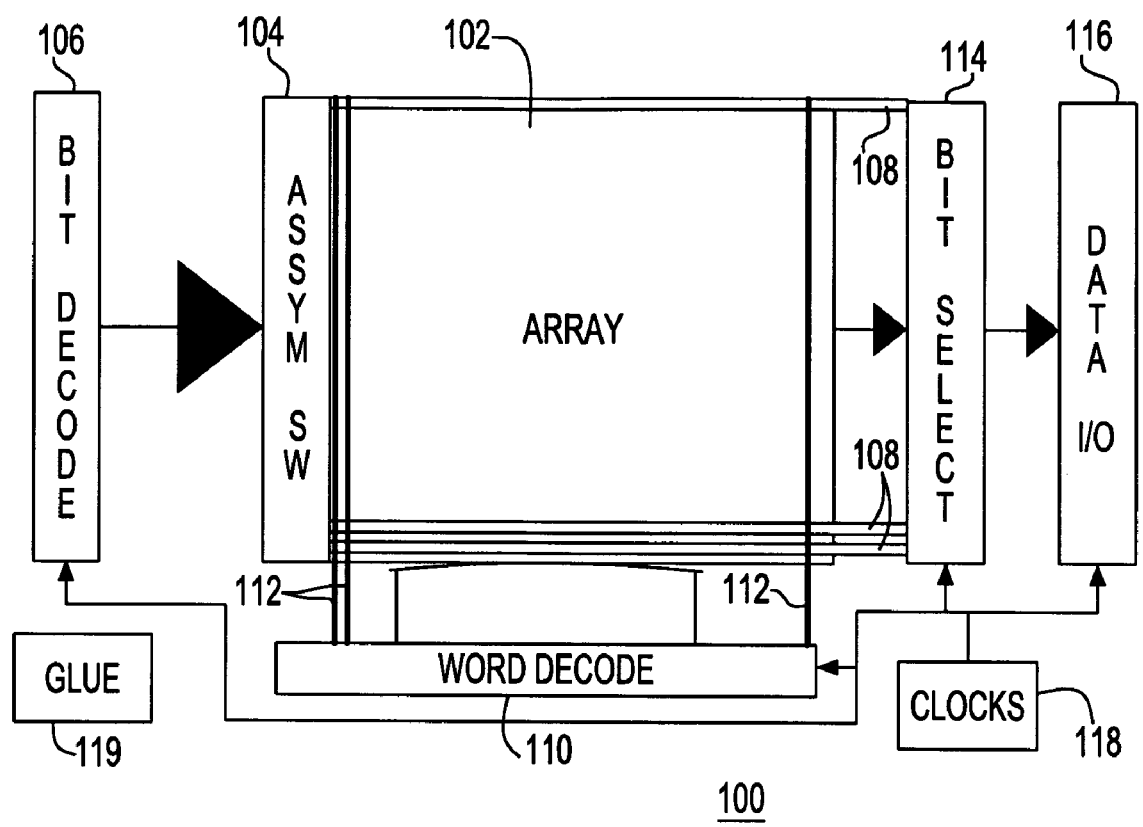
FIG. 1 shows an example of an M by N SRAM array with each cell supplied by a pair of independently coupled cell supply lines.

Turning now to the drawings and, more particularly, FIG. 1 shows an example of a storage circuit 100 (e.g., memory), macro or chip with each column of cells supplied by a pair of selectively asymmetric cell supply lines. Preferably, the storage circuit 100 includes an array 102, sub-array or array of sub-arrays of static random access memory (SRAM) cells formed in the insulated gate technology known as CMOS. Normally, cell symmetry is maintained as a nominal supply voltage is commonly supplied on both column supply lines of each pair. During cell accesses the supply voltage is unbalanced for each column with accessed cells by applying an offset voltage to one column supply line and maintaining the nominal supply at the other. The unbalanced supply voltages favor the data state being written/read by making cells on each accessed column asymmetric during the access.

Supply asymmetry switches 104 selectively provide a higher, offset voltage, mutually exclusively, to one or the other of the cell supply line pairs. A bit decode circuit 106 decodes a bit address to select one of N columns 108 of cells in the array 102. Each of the N columns 108 of cells in the array 102 is connected to one of N pairs of column supply lines. A word decoder 110 selects a row of cells by driving one of M local word lines 112. So, in this example, the M by N array 102 is addressed by coincidence of a selected row 112 with a selected column 108. During a read, bit select 114, which may include a sensing capability, selects one column 108 and buffers and redrives data that is stored in the selected cells in that column 108. An active/passive supply couple, e.g., located with supply asymmetry switches 104 or with the bit select 114, passes a nominal supply voltage to the array 102; and when appropriate, allows the supply asymmetry switches 104 to mutually exclusively pass an offset voltage to one or the other of a pair of column supply lines. Examples of suitable supply couples include a resistor, diode or FET connected between the array supply and each one of the column supply lines. Data input/output (I/O) drivers 116 receive input data and drive selected data from the bit select 114, e.g., off chip. Clock logic 118 provides local timing and glue logic 119 provides local control, e.g., read/write select, address gating and buffering, etc.

Normally, the supply asymmetry switches 104 are open. Matched supply voltages (nominal) are provided to each pair of column supply lines to maintain cell symmetry. During accesses, supply asymmetric switches 104 switch the higher offset voltage onto one side of cell in each column being accessed. Thus, the higher offset voltage unbalances the voltage on each pair of column supply lines, making the cells in each unbalanced column 108 asymmetric during the access. In particular, the offset voltage is switched such that the imbalance or asymmetry favors any data state being stored/read. So, the imbalance facilitates writing and reading data to and from preferred embodiment storage cells. It should be noted that while improving performance in almost any static array 102; the present invention is most advantageous to application in the CMOS technology known as partially depleted (PD) silicon on insulator (SOI) technology.

Figure 2A:
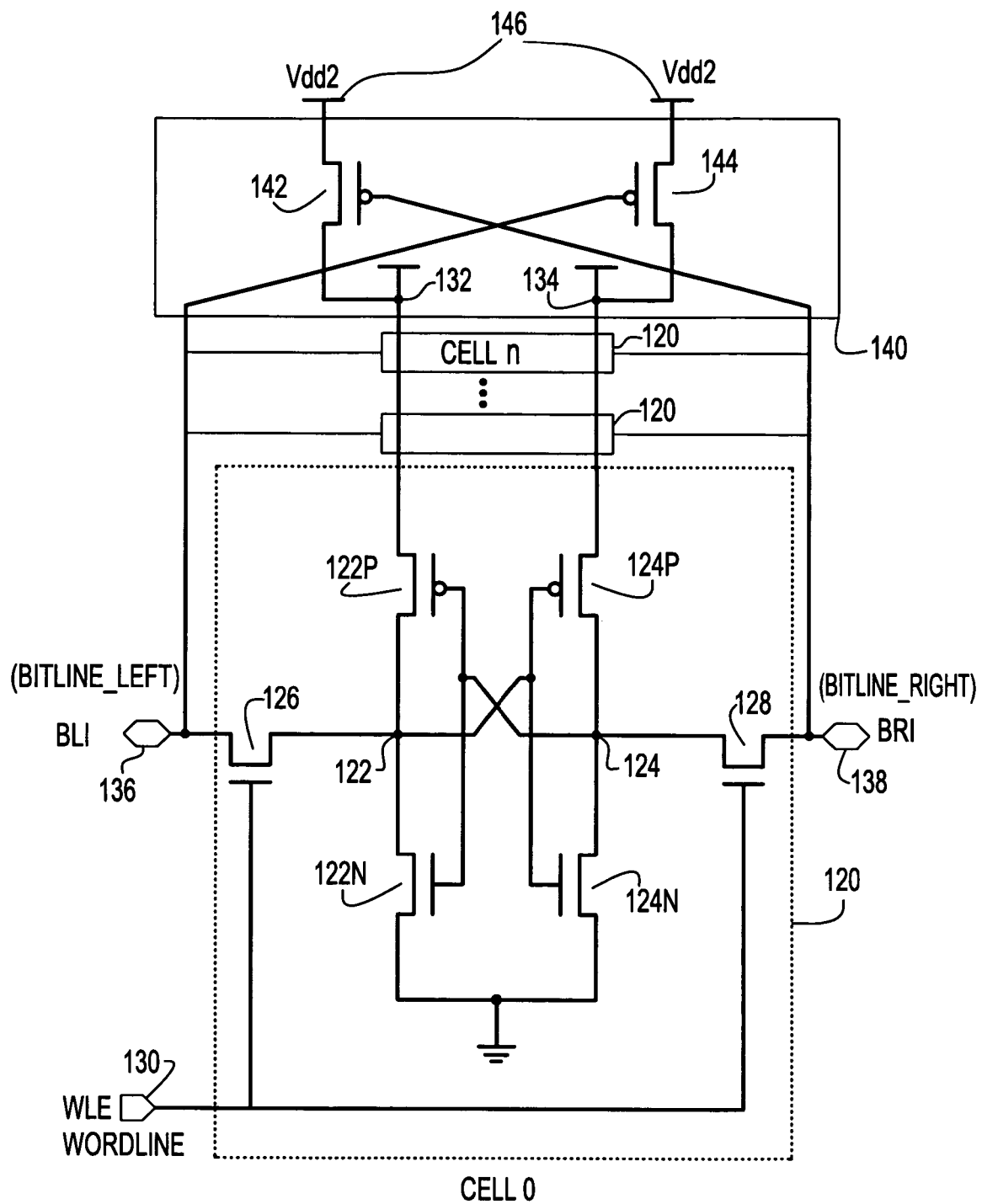
FIG. 2A shows an example of a column cross section including a preferred storage cell 120 connected to a dynamically asymmetric column supply switch.

FIG. 2A shows an example of a column 108 cross section including N preferred six transistor (6T) storage cells 120 (e.g., cell$_0$, . . . cell$_n$) or latches in an array 102 of such latches or cells 120, connected to a dynamically asymmetric column supply switch 140 in supply asymmetry switches 104. Data is stored in the cell 120 in a pair of cross-coupled inverters 122, 124, accessed through a pair of pass gate FETs 126, 128. Each inverter 122, 124 includes an NFET 122N, 124N and a PFET 122P, 124P connected drain to drain. A word line 130 gates the pass gate FETs 126, 128, which are connected at one end to inverters 122, 124, respectively. Column-supply lines 132, 134, uncoupled from each other, independently supply power to inverters 122, 124, respectively. Thus, each inverter 122, 124 is connected between one of the column supply lines 132, 134, respectively, and ground. A pair of complementary bit lines 136, 138 are connected to the other end of pass gate FETs 126, 128. Driving the word line 130 high turns on pass gate FETs 126, 128 to connect the complementary bit lines 136, 138 to the inverters 122, 124, respectively.

Each column receives power independently of other columns through independently coupled column-supply lines 132, 134. Dynamically asymmetric column supply switches 140 are, basically, a pair of PFETs 142, 144 in this example, each connected between an offset supply 146 and one of the independently coupled column-supply lines 132, 134. Complementary bit lines 138, 136 gate the PFET switches 142, 144, respectively. A nominal operating supply voltage is normally coupled to each of the column-supply lines 132, 134, e.g., resistively through a pair of transistors or unidirectionally through a pair of diodes. The offset supply 146 is higher than the nominal operating supply voltage, preferably, by a voltage substantially equivalent to the PFET threshold voltage or slightly therebelow. Thus, when one of the complementary bit lines 138, 136 droops or is pulled low during an access, a connected one of the PFET switches 142, 144 turns on, switching the offset supply to the respective column-supply line 132, 134, making cells on the column line asymmetric during the access.

Figure 2B:
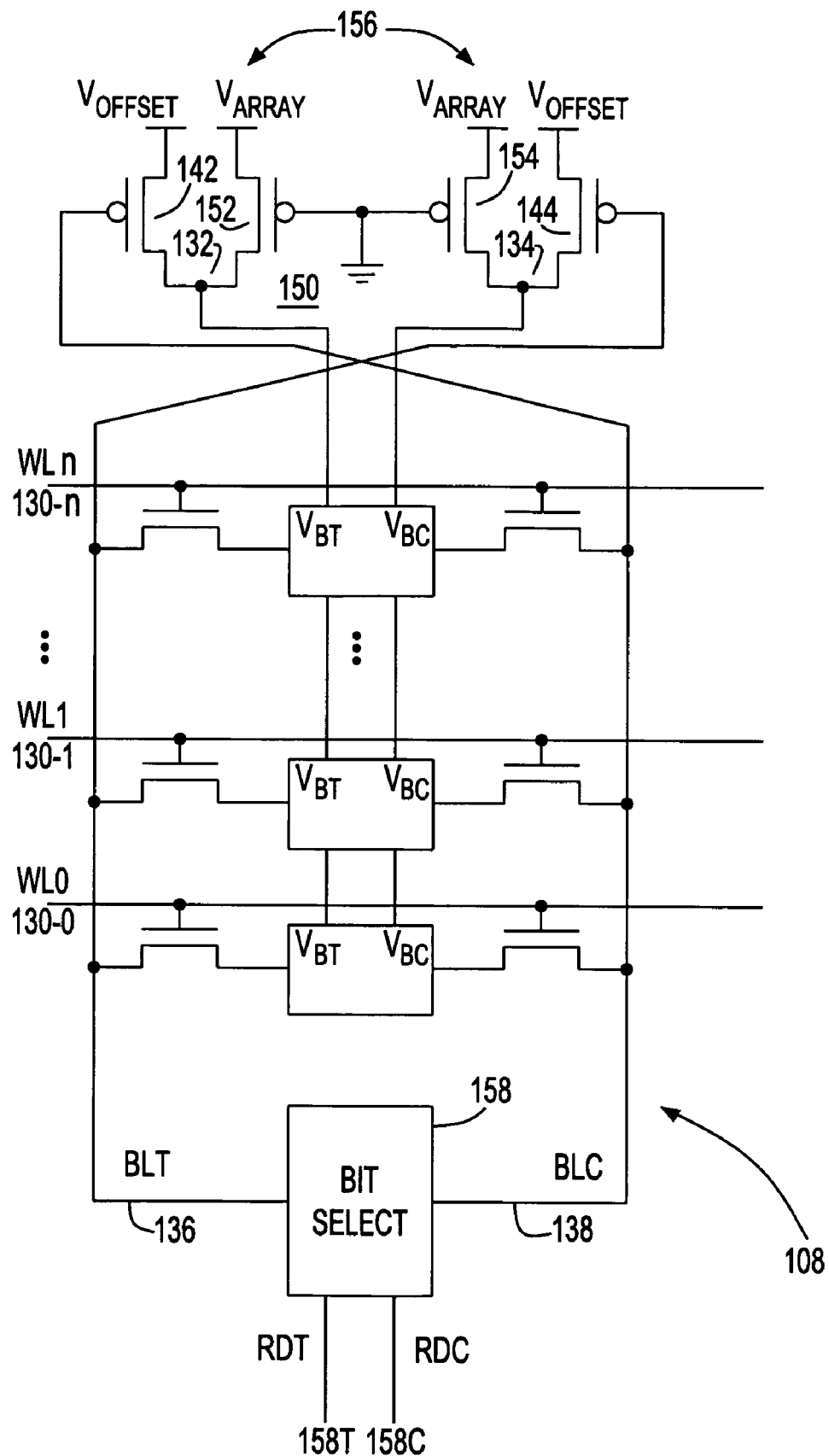
FIG. 2B shows an example of a dynamically asymmetric column supply switch and column supply couples for a single column.

FIG. 2B shows another example of a dynamically asymmetric column supply switch 150 that includes a nominal operating supply coupling devices 152, 154 located with dynamically asymmetric column supply switch 140. In this example, a pair of PFETs 152, 154 are connected between the nominal operating supply 156 and one of the column-supply lines 132, 134 for a single column 108 of cells at each of word lines 130-0, 13n-1, . . . 130-n and through bit select 158. Bit select 158 provides a complementary pair of outputs 158T and 158C and may be identical to bit select 114 of FIG. 1 or a subdivision thereof. The PFETs 152, 154 are gated on, i.e., with the gate of each PFET 152, 154 tied to ground. Thus, each PFET 152, 154 independently (resistively) couples each of the column-supply lines 132, 134 to the nominal operating supply 156. So, normally, the PFET 152, 154 hold both column-supply lines 132, 134 to the same matched voltage, i.e., the nominal operating supply 156. However, when either of the PFETs 142, 144 is on, that PFET 142, 144 provides sufficient current to overcome the on resistance of PFETs 152, 154 and, the respective column-supply line 132, 134 is pulled to the offset voltage. PFET coupling resistors 152, 154 are provided for example only and not intended as a limitation and column-supply lines 132, 134 may be coupled to the nominal operating supply 156 using any suitable equivalent such as a pair of diodes. Further, it should be noted that column-supply lines 132, 134 are referred to as being independently coupled because they are uncoupled from each other, being supplied independently from one another.

So, generally with respect to FIGS. 2A–B, each word line 130 is connected to pass gates 126, 128 in a row (112 in FIG. 1) of cells 120. Also, in each column 108, cells 120 are supplied by a pair of column-supply lines 132, 134 and are connected together and each pair of complementary bit lines 136, 138. Cell selection is by coincidence of a selected word line 130 with a selected bit line pair 136, 138, i.e., a row 112 with a column 108. Each pair of cross-coupled inverters 122, 124 are connected between a pair of column-supply lines 132, 134 and a supply return or array ground. An imbalance develops on the bit line pair 136, 138 during a read or a write that turns on a corresponding one of the PFETs 144, 142 (i.e., closes one of the switches), which boosts the supply voltage to one corresponding inverter 124, 122.

So, when one of the complementary bit lines 138, 136 is low (or lower than the other) a respective one of the PFETs 142, 144 is on, clamping one corresponding column-supply line 132, 134 to the offset voltage. Providing the offset voltage to an off-PFET (e.g., 122P) biases the off-PFET 122P at or near turn on without affecting the bias to the other cross-coupled inverter devices 122N, 124N, 124P. Providing the offset voltage to an on-PFET (e.g., 124P) biases both the on-PFET 124P and the on-NFET 122N on hard to improve cell drive without affecting the off devices 124N, 122P. The improved drive increases the drive available for switching complementary bit lines 136, 138. Thus, providing the offset voltage to one of the cross-coupled inverters 122, 124, facilitates switching the cell during a write and facilitates switching the pair of complementary bit lines 136, 138 during a read.

Before switching the cell 120 in a write, for example, one of the bit line pair, e.g., 136, is pulled low; the other 138 is held high; the output of inverter 122 is high; and, the output of inverter 124 is low. The low on 136 turns on PFET 144, while PFET 142 remains off or essentially off. With PFET 144 on, the offset voltage is supplied over supply line 134 to inverter 124, while the nominal voltage is supplied to inverter 122. Thus, when the word line 130 is raised to begin the write, the pass gates 126, 128 begin to couple the contents of the bit line pair 136, 138 to cross-coupled inverters 122, 124. So, the pass gate 126 connected to the low bit line 136 begins pulling the high-side low and, the pass gate 128 connected to the high bit line 136 begins to pulling the low-side high. As soon as the high output of inverter 122 droops sufficiently (depending upon the difference between the offset supply voltage and the nominal supply voltage), the off-PFET 124P turns on. Normally, turning the off-PFET on does not occur until the high output of inverter 122 droops below well the nominal supply voltage, i.e., by at least the PFET threshold voltage and at some time later during switching. While the pass gates 126 or 128 can pull the corresponding bit lines 136 or 138 down to a full low level (ground); since the pull up is a source follower configuration, the pass gates 126 or 128 can pull only the corresponding bit lines 136 or 138 to some level below the word line 130 voltage, e.g., $V_{dd}-V_T$. However, off-PFET 124P turning on assists pulling the low output of inverter 124 high to a full level. As the low output of inverter 124 is pulled high, the on-PFET 122P begins turning off. Thus, this early turn on of PFET 124P accelerates switching for an improved (shorter) write time. If the cell 120 is not being switched, the higher supply voltage to the high-side reinforces the cell contents, improving cell stability during the write.

Similarly, during a read, an imbalance on the column-supply lines 132, 134 boost cell drive and facilitates the read. Initially before a read, the bit line pair 136, 138 are equalized and clamped to a common voltage, e.g., the nominal supply voltage. So, when the word line 130 is raised, the pass gates 126, 128 begin to couple the contents of the cell 120 on cross-coupled inverters 122, 124 to the bit line pair 136, 138. The inverter with the low output, e.g., 122, begins pulling the connected bit line 136 low. As soon as the bit line 136 droops sufficiently (depending upon the difference between the offset supply voltage and the nominal supply voltage), the opposite PFET 144 turns on placing the offset voltage on supply line 134 to inverter 124, while the nominal voltage continues being supplied to inverter 122. Inverter 124 passes the higher offset voltage internally to the cell 120 as the input to inverter 122. The higher input voltage to inverter 122 turns on NFET 122N harder, which increases the drive pulling the bit line 136 low faster. Thus, this added drive accelerates switching for an improved (shorter) read time.

Figure 3:
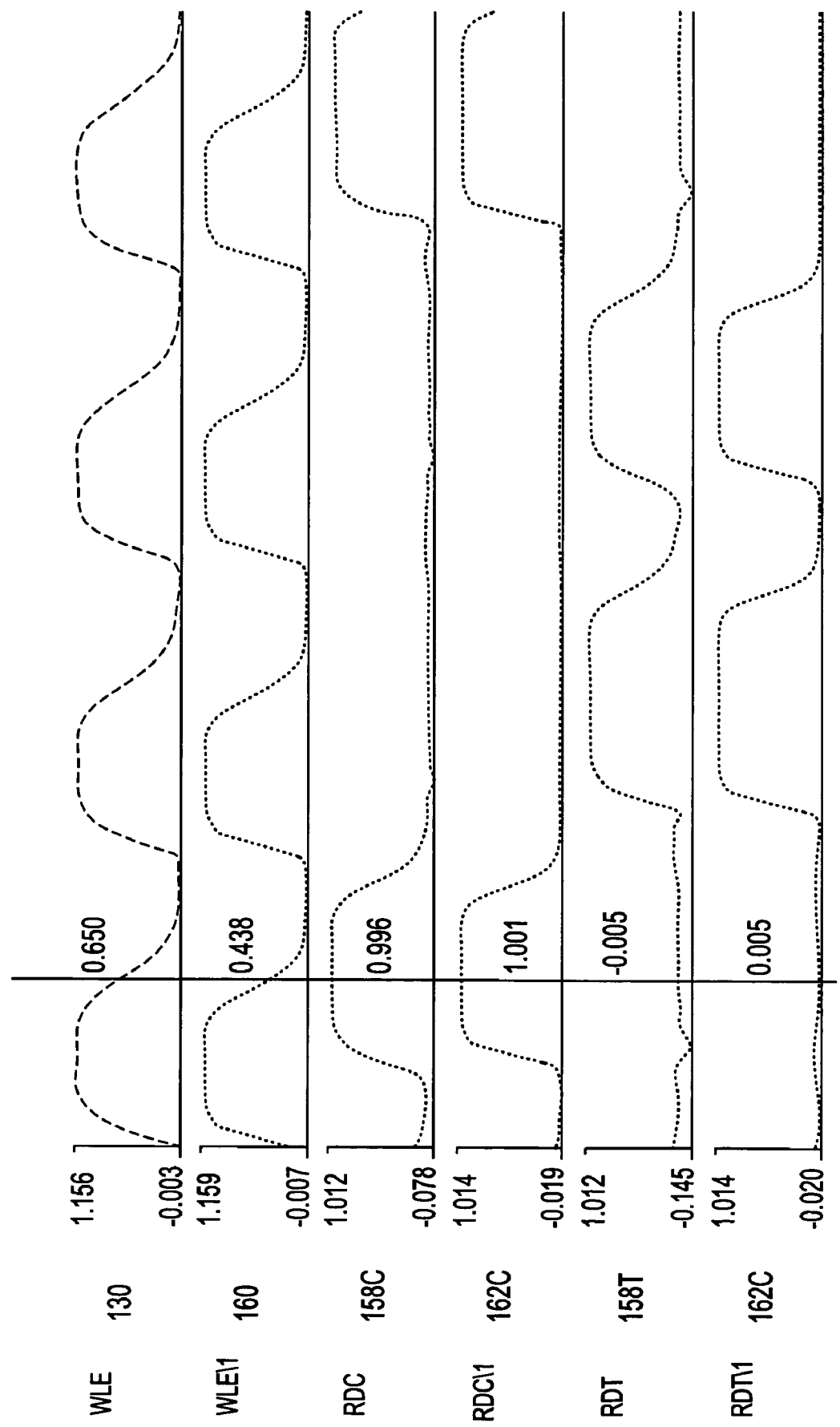
FIG. 3 shows a comparison of read times for a cross-section of an example of a preferred embodiment array with read times for a typical state of the art arrays with symmetric cells connected to a common shared supply line.

FIG. 3 shows an example comparing read times for a cross-section of a preferred embodiment array (e.g., column 108 of FIG. 2B) with read times for a typical state of the art arrays with symmetric cells connected to a common shared supply line. It should be noted that each of the compared signal plots of FIG. 3 show a slightly different voltage range (y-axis) with the x-axis (not shown) for preferred embodiment responses 158C, 158T markedly above the reference line, i.e., by 0.078 and 0.145V, respectively. In particular, the read time from word line selection 130 to data out 158C, 158T is compared against corresponding signals 160, 162C 162T, respectively, for an equivalent typical state of the art array with symmetric cells connected to a common shared supply line. As can be seen from comparing outputs 162C, 162T with corresponding preferred embodiment outputs 158C, 158T, in this example, the preferred embodiment array realizes a 15% read access improvement.

Figure 4:
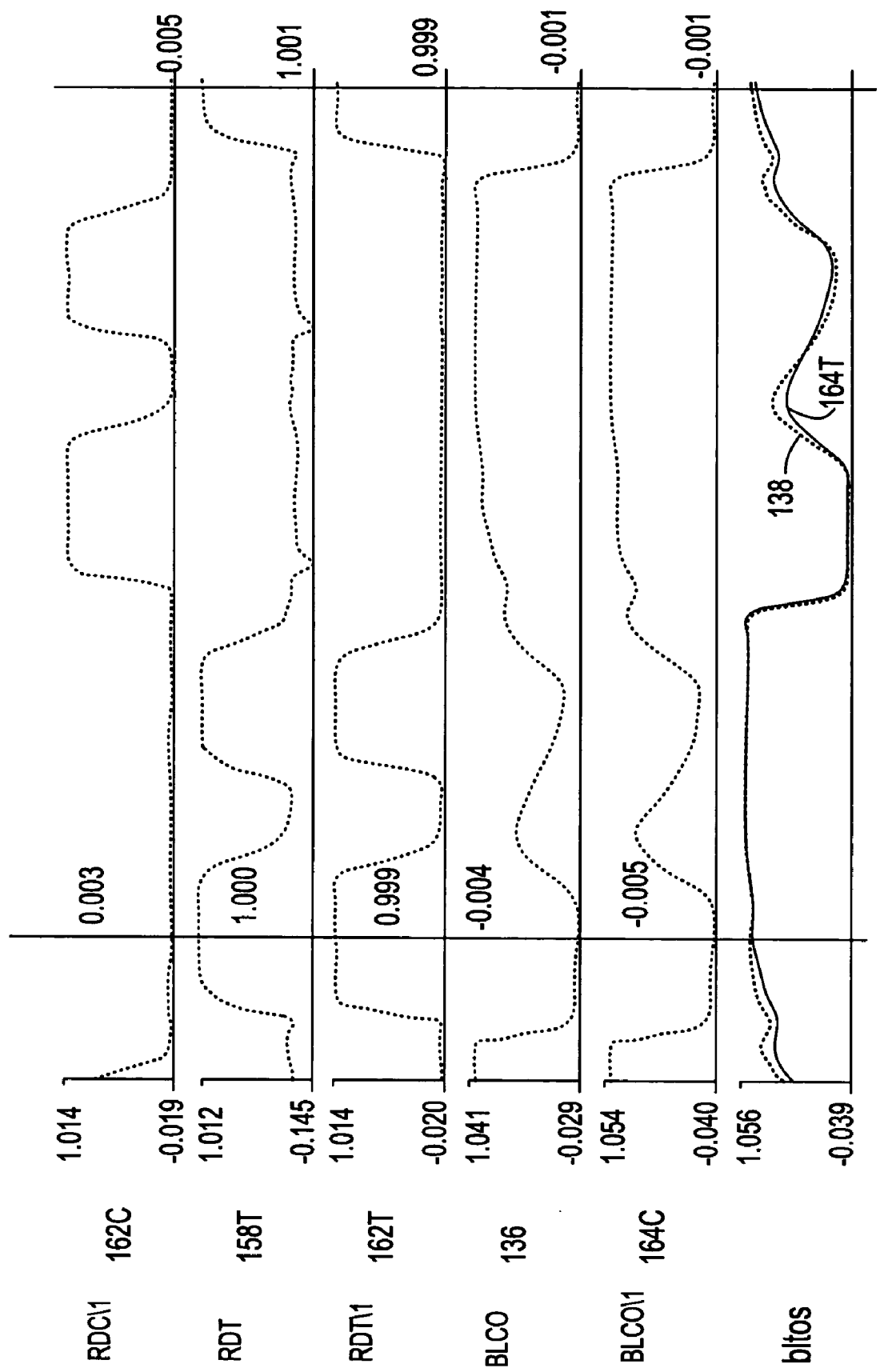
FIG. 4 shows a comparison of bit line slew for a preferred embodiment array with typical state of the art bit lines in an array with unswitched supply symmetric cells.

FIG. 4 shows an example comparing bit line 136, 138 slew for the same cross-section of preferred embodiment array (e.g., column 108 of FIG. 2B) with slew for typical state of the art bit lines 164C, 164T in an array with unswitched-supply symmetric cells. Again, it should be noted that each of the compared signal plots of FIG. 4 also show a slightly different voltage range (y-axis) with the x-axis (not shown) for responses and in particular preferred embodiment responses 158T above the reference line. Again it is apparent that the preferred embodiment array provides higher performance than a corresponding array with unswitched supply symmetric cells.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. An integrated circuit (IC) comprising:
   an array of storage cells arranged in rows and columns, each of said storage cells being connected to at least one pair of column-supply lines;
   an array supply couple independently coupling each column-supply line to a nominal supply voltage; and
   a mutually-exclusive supply-asymmetry switch pair at each said pair of column-supply lines selectively connecting either of said pair of column-supply lines to an offset supply voltage, said offset supply voltage being higher than said nominal supply voltage.

2. An IC as in claim 1, wherein said storage cells comprise a pair of cross-coupled inverters, each said pair of said cross-coupled inverters in a column of cells being connected between a corresponding said pair of column-supply lines and a supply return.

3. An IC as in claim 2, wherein said array is a static random access memory (SRAM) array, said storage cells are SRAM cells and each column of SRAM cells share said pair of column-supply lines.

4. An IC as in claim 3, wherein said IC is a CMOS IC and said mutually exclusive supply asymmetry switch pair comprises a pair of p-type field effect transistor (PFET) switches at each said column of SRAM cells, each of said pair of PFET switches being connected between said offset supply and one of said corresponding pair of column-supply lines.

5. A CMOS IC as in claim 4, wherein said array supply couple resistively couples each said column-supply line independently to said nominal supply voltage.

6. A CMOS IC as in claim 5, wherein said array supply couple comprises grounded gate PFETs connected between said nominal supply voltage and one said column-supply line.

7. A CMOS IC as in claim 4, wherein SRAM cells in each said column are connected to a complementary pair of bit lines and each of said pair of PFETs is gated by one bit line of a corresponding complementary pair of bit lines.

8. A CMOS IC as in claim 7, wherein said pair of complementary bit lines include a true bit line and a complement bit line, said pair of cross-coupled inverters include a true inverter and a complement inverter and each of said SRAM cells further comprises a pair of pass gates gated by a word select, one pass gate connected between said true inverter and said true bit line and the other pass gate connected between said complement inverter and said complement bit line.

9. A CMOS IC as in claim 8, wherein a first of said pair of PFETs is connected between said offset supply and said column-supply line supplying true inverters and gated by said complement bit line and a second of said pair of PFETs is connected between said offset supply and said column-supply line supplying complement inverters and gated by said true bit line.

10. A CMOS IC as in claim 9, wherein said pair of pass gates are NFET pass gates.

11. A CMOS IC as in claim 9, wherein each said row is a row of said SRAM cells, said NFET pass gates in each said row of SRAM cells being connected to a word line and each of said SRAM cells is further connected to a complementary pair of bit lines in one of said columns, said CMOS IC further comprising:
   at least one bit select selectively connected to a column of cells; and
   at least one input/output (I/O) driver, each said I/O driver passing written data to a selected said column and redriving stored data.

12. A CMOS IC as in claim 11, wherein said IC is on a partially depleted (PD) silicon on insulator (SOI) chip.

13. A PD SOI CMOS IC chip as in claim 12, wherein said array supply couple resistively couples each said column-supply line independently to said nominal supply voltage.

14. A PD SOI CMOS IC chip as in claim 13, wherein said array supply couple comprises grounded gate PFETs at each said column of SRAM cells, each of said grounded gate PFETs being connected between said nominal supply voltage and one said column-supply line.

15. A CMOS integrated circuit (IC) chip including an static random access memory (SRAM) array of SRAM cells arranged in rows and columns, said SRAM array comprising:
   an array supply line providing a nominal voltage to said SRAM array;
   a complementary pair of bit lines at each column, SRAM cells in said each column being connected to a corresponding said complementary pair of bit lines;
   a pair of column-supply lines at said each column, said SRAM cells in said each column being connected to a corresponding said pair of column-supply lines;
   an array supply couple at said each column, each said array supply couple independently coupling each of said corresponding pair of column-supply lines to said array supply line;
   an offset supply line; and
   a mutually-exclusive supply-asymmetry switch pair at said each column, each said mutually-exclusive supply-asymmetry switch pair selectively connecting either of said corresponding pair of column-supply lines to said offset supply line.

16. A CMOS IC chip as in claim 15, wherein each of said SRAM cells comprises:
   a pair of cross-coupled inverters, each of said cross-coupled inverters being connected between one of a corresponding said pair of column-supply lines and a supply return; and
   a pair of pass gates, each of said pair of pass gates being connected between one of said pair of cross-coupled inverters and a corresponding bit line.

17. A CMOS IC chip as in claim 16, wherein each said mutually exclusive supply asymmetry switch pair comprises a pair of p-type field effect transistor (PFET) switches connected between said offset supply line and one said column-supply line.

18. A CMOS IC chip as in claim 17, wherein each said pair of PFET switches is gated by one of said complementary pair of bit lines at a corresponding said column.

19. A CMOS IC chip as in claim 18, wherein each column-supply line is resistively coupled to said array supply line independently of other said column-supply lines.

20. A CMOS IC chip as in claim 19, wherein each said array supply couple comprises a grounded gate PFET connected between one said array supply line and one said column-supply line.

21. A CMOS IC chip as in claim 20, wherein each said pair of complementary bit lines includes a true bit line and a complement bit line, each said pair of cross-coupled inverters include a true inverter and a complement inverter and in each said SRAM cell, one pass gate is connected between said true inverter and said true bit line and the other pass gate is connected between said complement inverter and said complement bit line.

22. A CMOS IC chip as in claim 21, wherein a first of each said pair of PFET switches is connected between said offset supply line and a first column-supply line supplying said true inverter and is gated by said complement bit line; and, a second of said pair of PFET switches is connected between said offset supply and a second column-supply line supplying said complement inverter and gated by said true bit line.

23. A CMOS IC chip as in claim 22, wherein said pair of pass gates are NFET pass gates, said NFET pass gates in each row of SRAM cells being connected to a word line.

24. A CMOS IC chip as in claim 23, further comprising:
   at least one bit select selectively connected to a column of cells; and
   at least one input/output (I/O) driver, each said I/O driver passing written data to a selected said column and redriving stored data.

25. A CMOS IC chip as in claim 24, wherein said IC is on a partially depleted (PD) silicon on insulator (SOI) chip.

26. A CMOS static random access memory (SRAM) comprising:
   an array supply line providing a nominal supply voltage;
   al array of SRAM cells arranged in rows and columns, each of said rows SRAM cells connected to a word line, each of said columns of SRAM cells connected to a pair of column-supply lines and a complementary pair of bit lines, each of said SRAM cells comprising:
      a first inverter connected between a first column-supply line and a supply return,
      a second inverter connected between a second column-supply line and a supply return, an output said first inverter being an input to said second inverter and an output said second inverter being an input to said first inverter,
      a first pass gate connected between said output of said first inverter and a first bit line, and
      a second pass gate connected between said output of said second inverter and a second bit line, a local said word line gating said first pass gate and said second pass gate and a local complementary said bit line pair connected to said first bit line and said second bit line;

an array supply couple independently coupling each of said pair of column-supply lines to said array supply line;

an offset supply line; and a mutually-exclusive supply-asymmetry switch pair at said each column, each said mutually-exclusive supply-asymmetry switch pair selectively connecting either of said corresponding pair of column-supply lines to said offset supply line.

27. A CMOS SRAM as in claim 26, wherein said first pass gates and said second pass gates are NFET pass gates and, each said mutually exclusively supply asymmetry switch pair comprises a pair of p-type field effect transistor (PFET) switches connected between said offset supply line and said corresponding pair of column-supply lines.

28. A CMOS SRAM as in claim 27, wherein each said pair of PFET switches is gated by one of said complementary pair of bit lines at a corresponding said column.

29. A CMOS SRAM as in claim 28, wherein for each of said columns, a first of said pair of PFET switches is connected to said first column supply line and gated by said second bit line and a second of said pair of PFET switches is connected to said second column supply line and gated by said first bit line.

30. A CMOS SRAM as in claim 29, wherein each said column-supply line is resistively coupled to said array supply line independently of other said column-supply lines.

31. A CMOS SRAM as in claim 30, wherein each said array supply couple comprises grounded gate PFETs coupling said column-supply lines to said array supply line.

32. A CMOS SRAM as in claim 31, further comprising:
at least one bit select selectively connected to a column of cells; and at least one input/output (I/O) driver, each said I/O driver passing written data to a selected said column and redriving stored data.

33. A CMOS SRAM as in claim 32, wherein said IC is on a partially depleted (PD) silicon on insulator (SOD) chip.

34. A method of accessing data in a storage army, said storage array arranged in rows and columns, said method comprising the steps of:
a) selecting a row and one or more columns, said selected row and one or more columns identifying storage locations in said array being accessed; and
b) selectively unbalancing a pair of column supply lines in each selected column, wherein selectively unbalancing comprises raising one of said pair above an array supply voltage, the other of said pair remaining at said array supply voltage.

35. A method of accessing data as in claim 34, wherein selecting said row comprises raising a-word line.

36. A method of accessing data as in claim 35, wherein said word line is raised before said pair is unbalanced.

37. A method of accessing data as in claim 36, wherein raising said word line couples cell contents of cells in each of said columns to a complementary bit line pair in each said column, a signal developing on each said complementary bit line pair unbalancing a corresponding said pair of column supply lines.

38. A method of accessing data as in claim 35, wherein selecting said one or more columns comprises placing write data on a complementary bit line pair in each selected column, said complementary bit line pair unbalancing a corresponding said pair of column supply lines.

39. A method of accessing data as in claim 38, wherein said word line is raised after said data is placed on said bit line pair.

* * * * *